(12) United States Patent
Shoji

(10) Patent No.: US 6,396,159 B1
(45) Date of Patent: *May 28, 2002

(54) SEMICONDUCTOR DEVICE

(75) Inventor: Kazutaka Shoji, Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/104,575

(22) Filed: Jun. 25, 1998

(30) Foreign Application Priority Data

Jun. 27, 1997 (JP) ............................................. 9-187769

(51) Int. Cl.⁷ ............................................. H01L 23/29
(52) U.S. Cl. ....................... 257/788; 257/787; 257/778; 257/780; 257/784; 257/701; 257/668
(58) Field of Search ................................. 257/666, 668, 257/701, 738, 778, 787, 788, 780, 784; 438/118

(56) References Cited

U.S. PATENT DOCUMENTS

| | | | | |
|---|---|---|---|---|
| 5,181,097 | A | * 1/1993 | Ogata et al. | 257/788 |
| 5,665,795 | A | * 9/1997 | Koushima et al. | 523/233 |
| 5,683,942 | A | * 11/1997 | Kata et al. | 438/118 |
| 5,708,300 | A | * 1/1998 | Woosley et al. | 257/730 |
| 5,726,489 | A | * 3/1998 | Matsuda | 257/659 |
| 5,729,051 | A | * 3/1998 | Nakamura | 257/668 |
| 5,841,192 | A | * 11/1998 | Exposito | 257/701 |

FOREIGN PATENT DOCUMENTS

| | | |
|---|---|---|
| JP | 53-85163 | 7/1978 |
| JP | 55-175249 | 12/1980 |
| JP | 58-79739 | 5/1983 |
| JP | 2-281746 | 11/1990 |
| JP | 4-316356 | 11/1992 |
| JP | 5-218240 | 8/1993 |
| JP | 5-283460 | 10/1993 |
| JP | 6-209055 | 7/1994 |
| JP | 6-349893 | 12/1994 |
| JP | 7-321157 | 12/1995 |
| JP | 6158248 | 3/1996 |
| JP | 8335653 | 12/1996 |
| JP | 9-153564 | 6/1997 |

OTHER PUBLICATIONS

Lau, John H. "Chip on Board Technologies for Multichip Modules". New York: Chapter & Hall. Pp. 472–483, 1994.*

Japanese Office Action received Jun. 1, 1999 in corresponding Japanese Application.

English translation of selected portions of Jun. 1, 1999 Japanese Office Action.

English translation of Jun. 27, 2000 Korean Office Action.

* cited by examiner

Primary Examiner—Minh Loan Tran
Assistant Examiner—Luan Thai
(74) Attorney, Agent, or Firm—Dickstein Shapiro Morin & Oshinsky LLP

(57) ABSTRACT

A semiconductor device which eliminates a thermal stress in the semiconductor device or warp in a package of the semiconductor device to increase reliability. To achieve this, the semiconductor device has a structure in which an insulation flexible film and a semiconductor chip are stuck together. The insulation flexible film has on the obverse side a plurality of electrode pads and, on the reverse side, a plurality of electrodes electrically connected to the plurality of electrode pads. The semiconductor chip is sealed on the chip-mounting side of the insulation flexible film with resin, with a thickness of the resin above the semiconductor chip equal to or less than the thickness of the semiconductor chip.

6 Claims, 7 Drawing Sheets

1 : TAPE (FLEXIBLE FILM)
2 : CHIP
3 : MOLD RESIN
4 : SOLDER BUMP (BUMP ELECTRODE)

(A)

(B)

(C)

1 : TAPE (FLEXIBLE FILM)
2 : CHIP
3 : MOLD RESIN
4 : SOLDER BUMP (BUMP ELECTRODE)
5 : BONDING WIRE (A)

(B)

1 : TAPE (FLEXIBLE FILM)
2 : CHIP
3 : MOLD RESIN
4 : SOLDER BUMP (BUMP ELECTRODE)

(A)

(B)

(C)

1 : TAPE (FLEXIBLE FILM)
2 : CHIP
3 : MOLD RESIN
4 : SOLDER BUMP (BUMP ELECTRODE)
5 : BONDING WIRE (A)

(B)

1 : TAPE (FLEXIBLE FILM)
2 : CHIP
3 : MOLD RESIN
4 : SOLDER BUMP (BUMP ELECTRODE)

1 : TAPE (FLEXIBLE FILM)
2 : CHIP
3 : MOLD RESIN
4 : SOLDER BUMP (BUMP ELECTRODE)
5 : BONDING WIRE
6 : SUBSTRATE (A) COEFFICIENT OF THERMAL EXPANSION
LARGE
SMALL (B) (HIGH TEMPERATURE)

(C) (LOW TEMPERATURE)

1 : TAPE (FLEXIBLE FILM)
2 : CHIP
3 : MOLD RESIN
4 : SOLDER BUMP (BUMP ELECTRODE)
6 : SUBSTRATE

SEMICONDUCTOR DEVICE

FIELD OF THE INVENTION

The present invention relates to a semiconductor device, and more particularly to a package structure that may be applied to a chip size package (hereafter called "CSP"), fine pitch ball grid array (hereafter called "FBGA"), and so forth.

BACKGROUND OF THE INVENTION

A ball grid array (BGA) package and a land grid array (LGA) have been known as the package structure of a semiconductor device. For a semiconductor with this structure, the chip carrier, which contains a semiconductor, has external electrode pads arranged on a grid on one side of the package. As compared with a quad flat package (QFP), this semiconductor device is greatly reduced in size because it has the external electrode pads on one side of the package. In addition, the pin-to-pin pitch, 1.5 mm or 1.27 mm, is relatively large as compared with that of a QFP which is 0.3 mm or 0.5 mm, making installation easier. Thanks to these advantages, BGA and LGA packages have been accepted as new semiconductor devices.

To make the package further smaller and to increase its density, a smaller BGA package was disclosed, for example, by Japanese Patent Kokai Publication No. JP-A-7-321157. This package comprises a semiconductor chip which has a plurality of connection pads on the surface; and a film carrier which has a wiring layer on the surface and a plurality of conductive bumps on the reverse side with the wiring layer and the bumps connected to the electrode pads via through-holes, in which a part of the wiring layer of the film carrier is connected to the pads on the semiconductor chip. In general, this type of package is substantially similar in size to the semiconductor chip which is mounted on the package, and the semiconductor device is built by mounting the semiconductor chip on the semiconductor package.

More specifically, an insulation film made of such materials as polyimide resin is attached with an adhesive on the surface, except on the electrode pads, of the semiconductor chip of a semiconductor device mounted on a semiconductor package. On the wiring on the insulation film are provided conductive bumps (hereafter called bumps) which are electrically connected to electrode pads on the semiconductor chip. The wiring on the insulation film is protected by a cover coat.

These bumps, arranged on a matrix on the insulation film, stick out of the cover coat.

The outer side of the insulation film on which the semiconductor is not attached and the part of the semiconductor chip on which the insulation film is not attached are sealed with mold resin.

A semiconductor device having this semiconductor package, which takes up space approximately equal to, or a little bit larger than, that of the semiconductor chip, may be mounted on a substrate such as a mother board, making it possible to mount many semiconductor devices in a limited space.

While the external electrode pads on the conventional BGA are arranged at a pitch of 1.27 mm–1.00 mm, the external electrode pads on the CSP or FBGA are arranged at a pitch of 0.8 mm or less to ensure high-density packaging. FIG. 6 shows a cross sectional view of the conventional CSP mounted on a substrate. In FIG. 6, 1 refers to an insulation flexible film, 2 refers to a semiconductor chip, 3 refers to a mold resin, 4 refers to solder bumps and 6 refers to the substrate on which the semiconductor device is mounted. As shown in the figure, the electrode pads on the semiconductor chip 2 are connected directly to the conductive electrode bumps (not shown in the figure) on the reverse side of an insulation flexible film 1.

SUMMARY OF THE DISCLOSURE

It is expected that a semiconductor device with a semiconductor package will have more pins as the semiconductor chip have more electrode pads. To cope with the increase in the number of electrode pads, it is necessary to increase the number of bumps, to reduce the pitch between each two bumps, and to reduce the size of the bump.

The reduction in the pad-to-pad pitch and in the bump size to accommodate more pins results in a weak connection between the bumps and the lands disclosed on the insulation film.

In addition, the reduction in the bump size reduces the clearance between the semiconductor device and the substrate, affecting reliability when the temperature changes after installation.

The semiconductor package with this structure, with a sealing resin not only on the top or bottom of the semiconductor chip but also on the sides, allows bumps to be provided on the pads directly below the semiconductor chip (hereafter called "Pan-in") as well as on the outer parts (hereafter called "fan-out") of the semiconductor chip.

However, the analysis made by the inventor of this invention reveals that a change in the temperature caused by the heat generated within the semiconductor device causes a thermal stress in the semiconductor device and, in addition, warps the package resulting in a reduced reliability after mounting (see FIG. 7). Assume a mold resin 3 has a large coefficient of thermal expansion and the semiconductor chip 2 has a small coefficient of thermal expansion. Then, the package warps as shown in FIG. 7 (B) when the temperature is high, and as shown in FIG. 7 (C) when the temperature is low because the resin side shrinks, based on the difference in the coefficient of thermal expansion.

According to a primary object of the present invention seeks to solve the problems associated with a thermal stress generated in the semiconductor device and a warp in the package caused by the thermal stress.

It is a concrete object of this invention is to provide a semiconductor device which reduces a thermal stress and therefore reduces or eliminates a warp in the semiconductor device and which ensures connection reliability of the semiconductor device.

Further objects of the present invention will become apparent in the entire disclosure.

To achieve the above objects, a semiconductor device according to a first aspect of the present invention provides a semiconductor device in which an insulation flexible film is laminated to a semiconductor chip, the insulation flexible film having on an obverse side thereof a plurality of electrode pads and having on a reverse side thereof a plurality of electrodes electrically connected to the plurality of electrode pads, the semiconductor chip being sealed on the chip-mounting side of the insulation flexible film with a resin, wherein the resin has a thickness on the semiconductor chip equal to or less than the thickness of the semiconductor chip.

According to a second aspect of the present invention there is provided a semiconductor device in which an insulation flexible film is laminated to a semiconductor chip, the insulation flexible film having on an obverse side thereof a plurality of electrode pads and having on a reverse side thereof a plurality of electrodes electrically connected to the plurality of electrode pads, the semiconductor chip being sealed on the chip-mounting side of the insulation flexible film with a resin, wherein the thickness of the resin sealing the sides of the semiconductor chip is equal to or less than the thickness of the semiconductor chip.

According to a third aspect of the present invention there is provided a semiconductor device as defined by the first aspect wherein the thickness of the resin disposed on the top of the semiconductor chip is equal to or less than the thickness of the semiconductor chip and wherein the height of the resin sealing the sides of the semiconductor chip is lower than the height of the resin sealing the semiconductor chip.

According to a fourth aspect of the present invention there is provided a semiconductor device as defined by the first aspect wherein the thickness of the resin disposed at an outer portion of the resin sealing the sides of the semiconductor chip is less than the thickness of the resin at an inner portion immediately sealing the sides of the semiconductor device.

PREFERRED EMBODIMENTS

According to this invention the semiconductor device has a semiconductor chip stuck on an insulation film with a wiring layer, and the semiconductor chip is sealed on the chip-mounting side of the insulation film with a resin, wherein the thickness of the sealing resin on the top of the semiconductor chip is less than the thickness of the semiconductor chip.

This invention reduces a warping introduced by a difference between the coefficient of thermal expansion of the semiconductor chip and that of the sealing resin when the temperature changes. This, in turn, reduces stress generated in the electrical contacts provided between the semiconductor device and the substrate, thereby increasing the reliability of the semiconductor device package.

According to the third and fourth aspects even as warping is introduced by the difference in the coefficient of thermal expansion between the semiconductor chip and that of the sealing resin when the temperature changes, a stress transmitted to the electrical contacts other than those provided between the semiconductor chip and the substrate, is reduced thereby increasing the reliability of the semiconductor device package.

DETAILED DESCRIPTION OF THE PREFERRED EMBODIMENTS

Embodiments according to the present invention are described below with reference to the drawings. In the following embodiments, a semiconductor device is assumed to have solder bumps within a part (fan-in) located directly below the semiconductor chip and an outer part extending out (fan-out) of the semiconductor chip.

Figure 1:
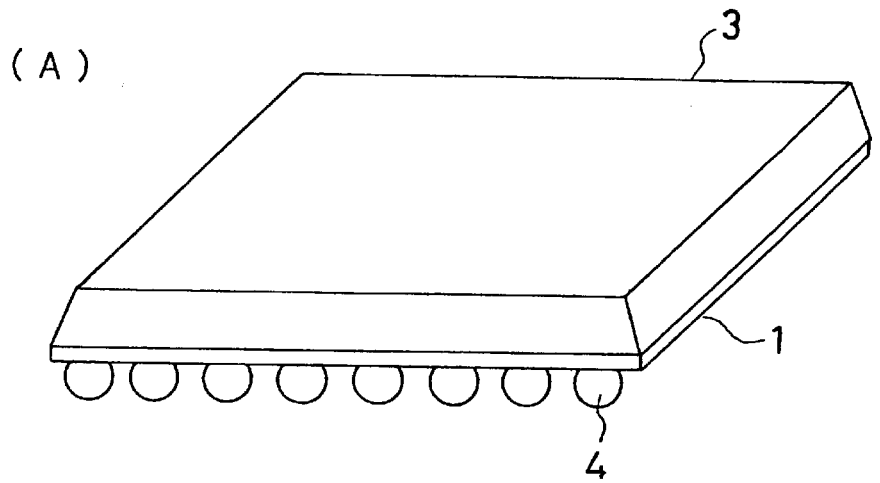
FIG. 1 is a view showing the structure of a semiconductor device of an embodiment according to a first aspect of the present invention.
Figure 1:
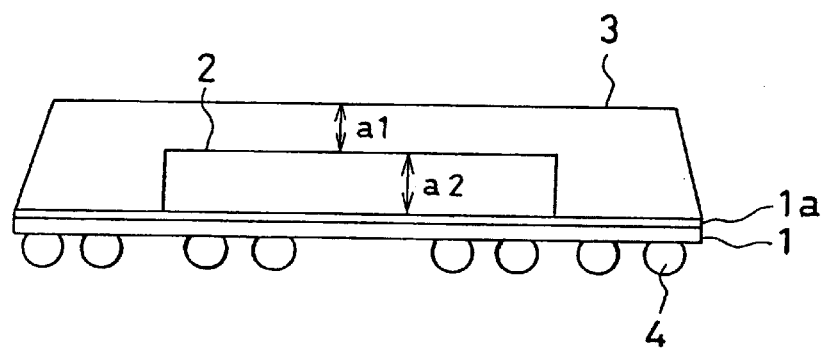
Figure 1:
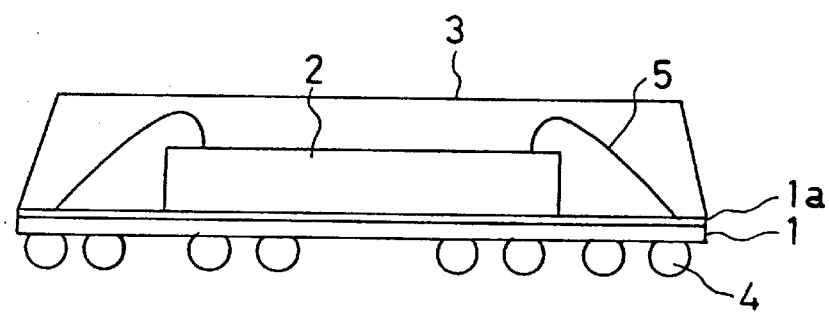

FIG. 1 shows the configuration of an embodiment of the semiconductor device according to the first aspect. FIG. 1 (A) is a perspective view, and FIGS. 1 (B) and 1 (C) are sectional views. As shown in FIG. 1, the semiconductor device of this embodiment has an insulation film 1 having electrode pads. This film and a semiconductor chip 2 are stuck together and are sealed with a sealing resin 3. Polyimide resin is used as the insulation flexible film, and a mold resin as the sealing resin.

In this embodiment, the semiconductor chip 2 and the insulation film 1 are stuck together with thermoplastic polyimide 1$a$. To reduce stress, silicone resins may also be used. To securely stick the semiconductor chip and the insulation film together, a thermosetting epoxy resin may also be used. In addition, as shown in FIG. 1 (C), silver paste may be used as a mount paste.

In this embodiment, the electrode pads on the semiconductor chip 2 are electrically connected to the electrode pads on the reverse side of the insulation film 1 by directly connecting the electrode pads on the semiconductor chip 2 to the conductive electrode bumps (not shown in the figure) on the reverse side of the insulation film 1. This may also be accomplished by electrically connecting the electrode pads on the semiconductor chip 2 to the electrode pads on the reverse side of the insulation film 1 with gold bonding wires 5 as shown in FIG. 1 (C).

The reverse side of the insulation film 1 and the semiconductor chip 2 are sealed with the sealing resin 3. In this case, a1=a2 or a1<a2, where the thickness of the mold resin 3 above the semiconductor chip 2 is a1 and the thickness of the semiconductor chip 2 is a2. a1, the thickness of the mold resin 3 above the semiconductor chip 2, ranges 0 $\mu$m to 350 $\mu$m, and a2, the thickness of the semiconductor chip 2, ranges 300 $\mu$m to 400 $\mu$m.

The thinner the sealing resin (a1) above the semiconductor chip 2 is, the better the temperature cycle test result is. However, an attempt to produce extremely thin sealing resins with the sealing mold (die) method sometimes results in improper filling.

In this embodiment, the sealing resin, 100 $\mu$m or less in mold thickness, above (on the top of) the semiconductor chip 2 is produced by creating the resin above the semiconductor chip 2 and then polishing or etching it.

Because the linear expansion coefficient of the part of the mold resin near the semiconductor chip is small, this embodiment uses a resin with the linear expansion coefficient of about 11 ppm.

This embodiment lowers the linear expansion coefficient of the mold resin by adding more fillers to the mold resin 3. Ideally, the mold resin should contain 85–95 wt % of fillers. The resin is better filled with fillers which are as spherical as possible. This embodiment uses fillers whose average sphericity is 90 or higher. The sphericity is a ratio of the shorter diameter to the longer diameter which is 100.

In addition, the semiconductor chip 2 may have no resin on the top. In this case a1=0, and the part of the semiconductor chip 2 is not covered with sealing resins. It should be noted that this structure may not be applied to the one shown in FIG. 1 (C).

In this embodiment, the solder bumps 4, round solder balls are disposed on an electrode pad (not shown in the figure). A plurality of solder bumps 4 are arranged across all the electrode mounting surface.

Figure 2:
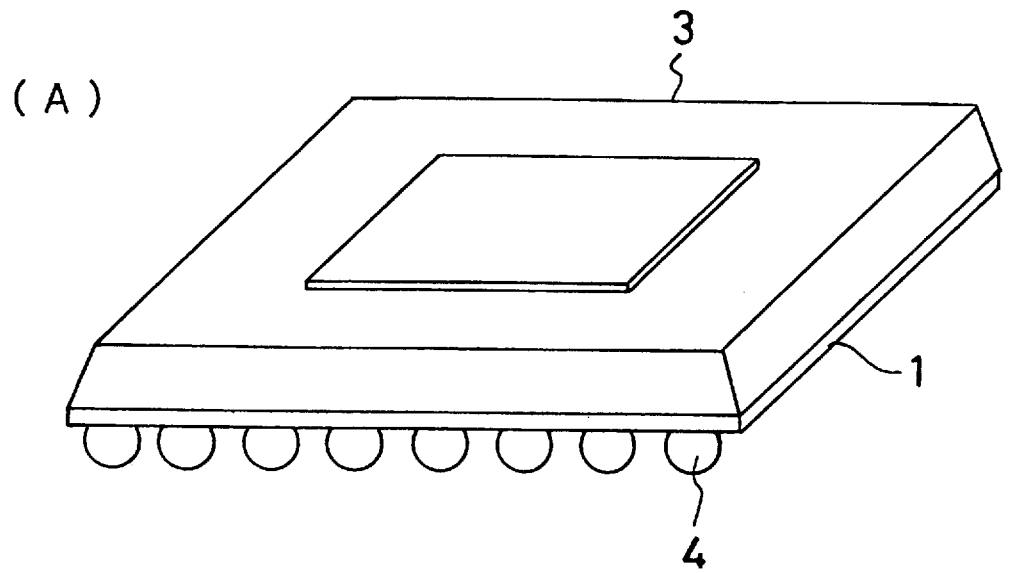
FIG. 2 is a view showing the structure of a semiconductor device of an embodiment according to a second aspect of the present invention.
Figure 2:
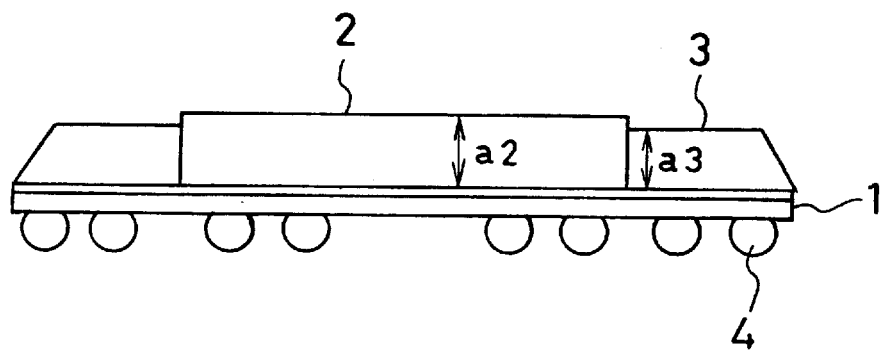

FIG. 2 is a diagram showing the configuration of a semiconductor device according to the second aspect. FIG. 2 (A) is a perspective view, and FIG. 2 (B) is a sectional view. The numbers of components in FIG. 2 corresponding to those in FIG. 1 are the same and the description of such components are not repeated.

In this embodiment, a2, the thickness of the semiconductor chip 2, is the same as that in FIG. 1.

FIG. 2 (B) shows that a2≧a3, where a3 is the thickness of the mold resin 3 sealing the sides of the semiconductor chip 2. When a2=a3 in FIG. 2 (B), the structure of the semiconductor device is virtually equal to that of the semiconductor device in FIG. 1 (B) where a=0.

Figure 3:
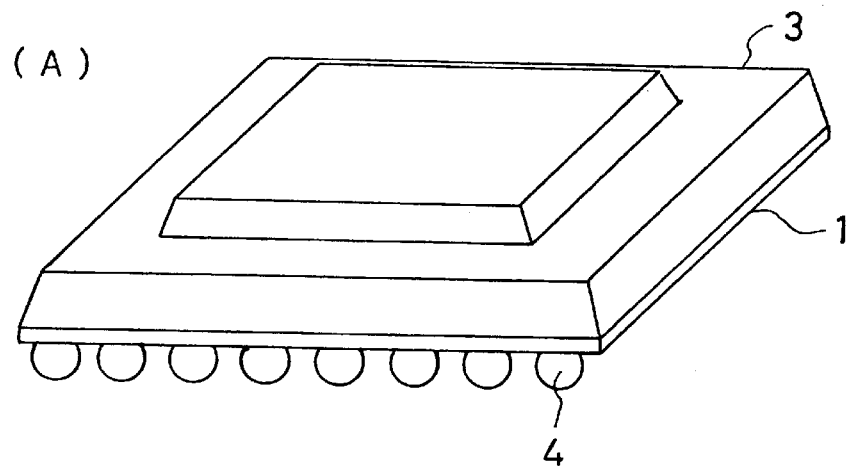
FIG. 3 is a view showing the structure of a semiconductor device of an embodiment according to a third aspect of the present invention.
Figure 3:
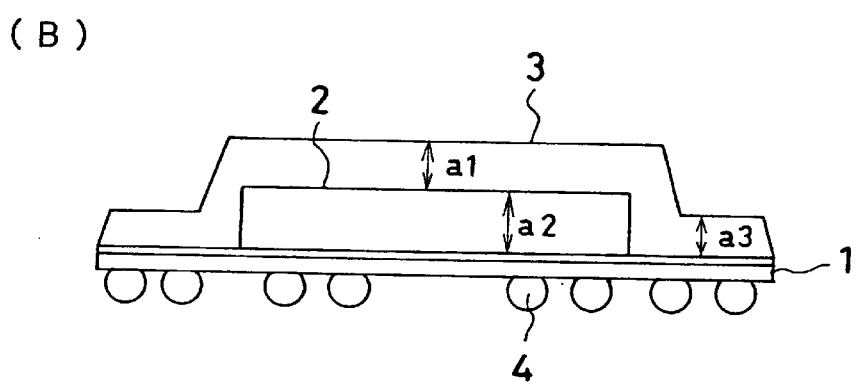
Figure 3:
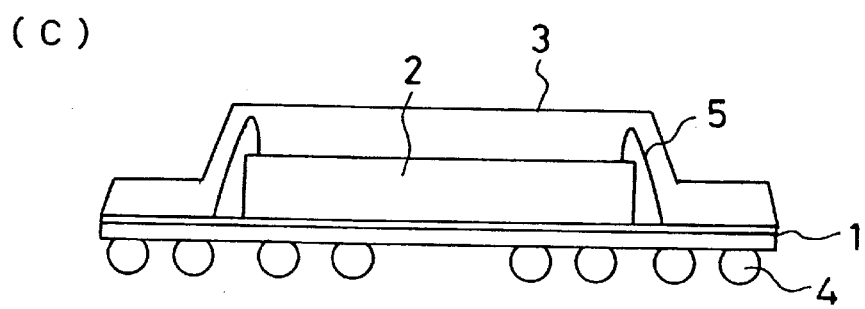

FIG. 3 is a diagram showing the configuration of a semiconductor device according to the third aspect. FIG. 3 (A) is a perspective view, and FIGS. 3 (B) and 3 (C) are sectional views. The numbers of components in FIG. 3 corresponding to those in FIG. 1 are the same and the description of such components are not repeated.

FIG. 3 (B) shows that $$a3<(a1+a2)$$

where a1 is the thickness of the mold resin 3 directly above the semiconductor chip 2, a2 is the thickness of the semiconductor chip 2, and a3 is the thickness of the mold resin 3 sealing the sides of the semiconductor chip 2 (i.e., outer rim area surrounding the sides of the chip 2).

In addition, the semiconductor chip 2 may have no resin on the top. In this case a1=0, and the part of the semiconductor chip 2 is not covered with sealing resins. It should be noted that this structure may not be applied to the one shown in FIG. 3 (C).

Figure 4:
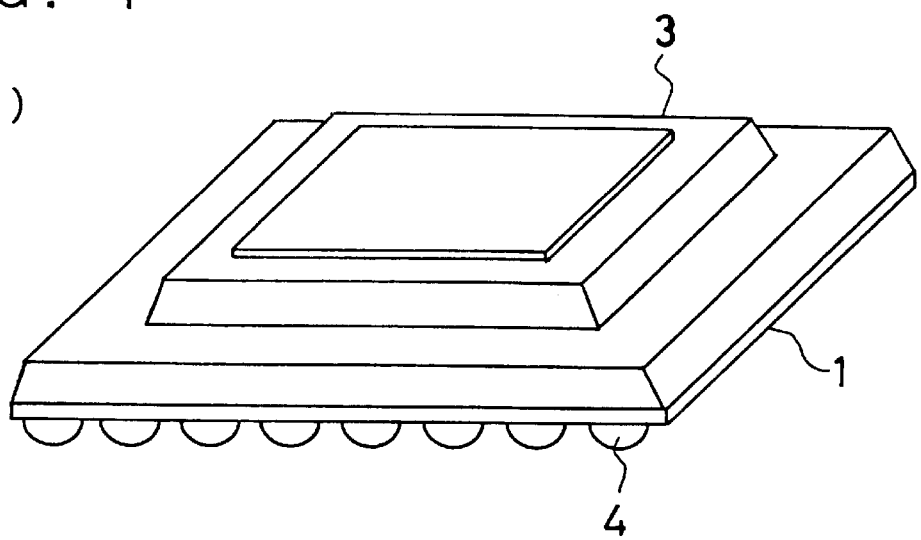
FIG. 4 is a view showing the structure of a semiconductor device of an embodiment according to a fourth aspect of the present invention.
Figure 4:
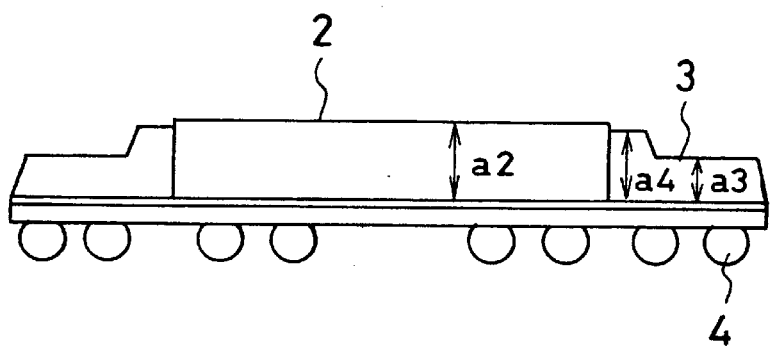

FIG. 4 is a diagram showing the configuration of the semiconductor device according to the fourth aspect. FIG. 4 (A) is a perspective view, and FIG. 4 (B) is a sectional view. The numbers of components in FIG. 4 corresponding to those in FIG. 1 are the same and the description of such components are not repeated.

FIG. 4 (B) shows that a2=a4 or a2>a4 and a4=a3 or a4>a3, where a2 is the thickness of the semiconductor chip 2, a4 is the thickness of the mold resin 3 sealing immediately the sides of the semiconductor chip 2, and a3 is the thickness of the outer rim of the mold resin 3. Suppose a4=a3 in FIG. 4 (B), then the structure is virtually equal to that shown in FIG. 2 (B).

EXAMPLES

The embodiments of the various aspects of the present invention given above will be described more in more detail by way of examples referring to the drawings. Semiconductor devices used in the embodiments explained with reference to FIGS. 1 and 2 were mounted on a substrate, and the following reliability test (temperature cycle test) was made. The test result is shown in FIG. 5.

Temperature cycle condition: −25° C.–to 125° C. (10 minutes at low temperature, 10 minutes at high temperature)

Figure 5:
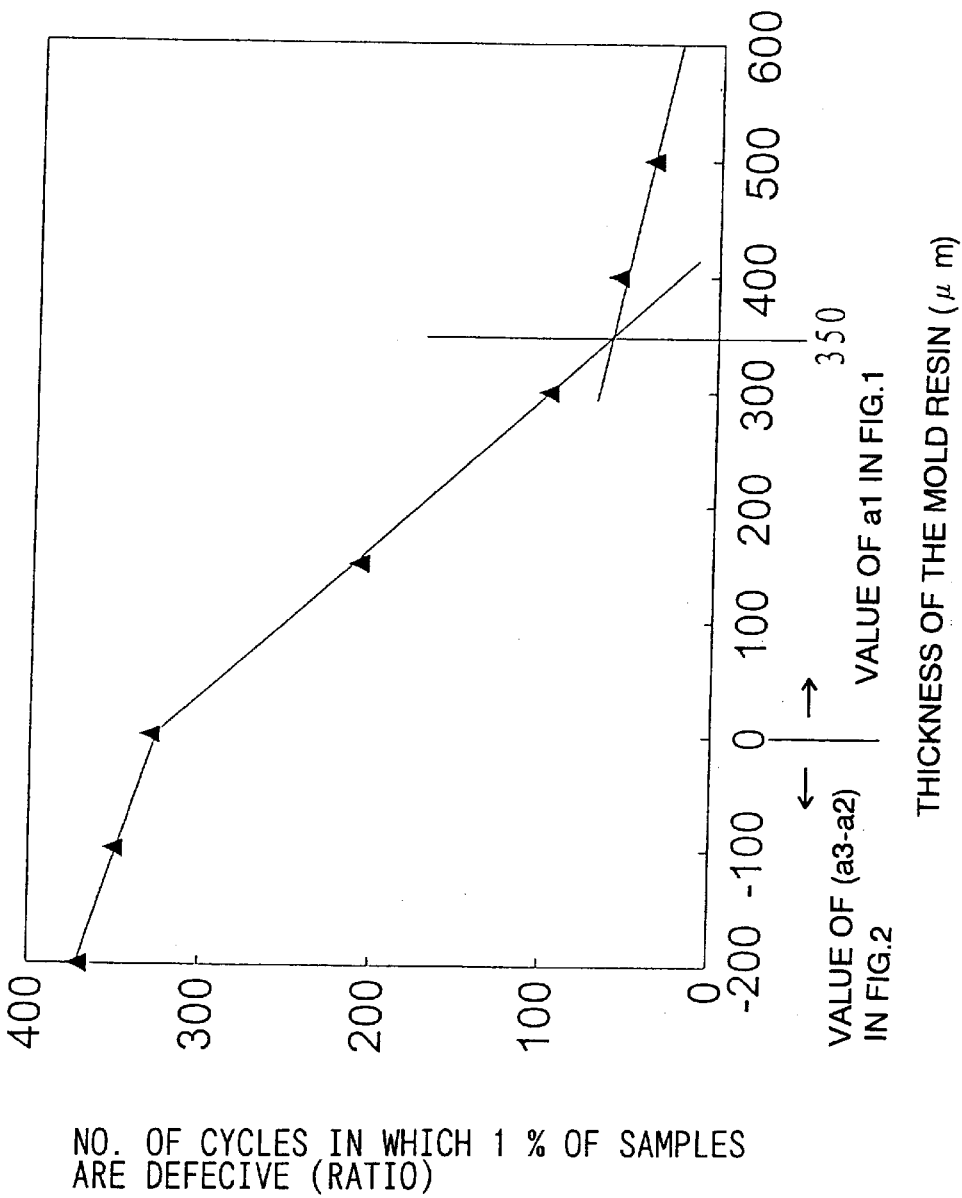
FIG. 5 is a graph showing the result of a temperature cycle test.
Figure 6:
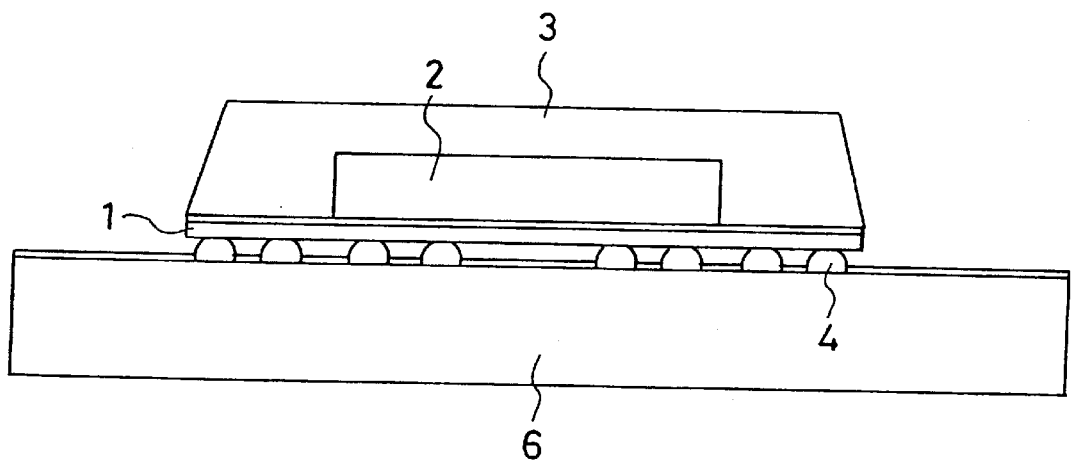
FIG. 6 is a view showing the structure of the semiconductor device mounted on a substrate.
Figure 7:
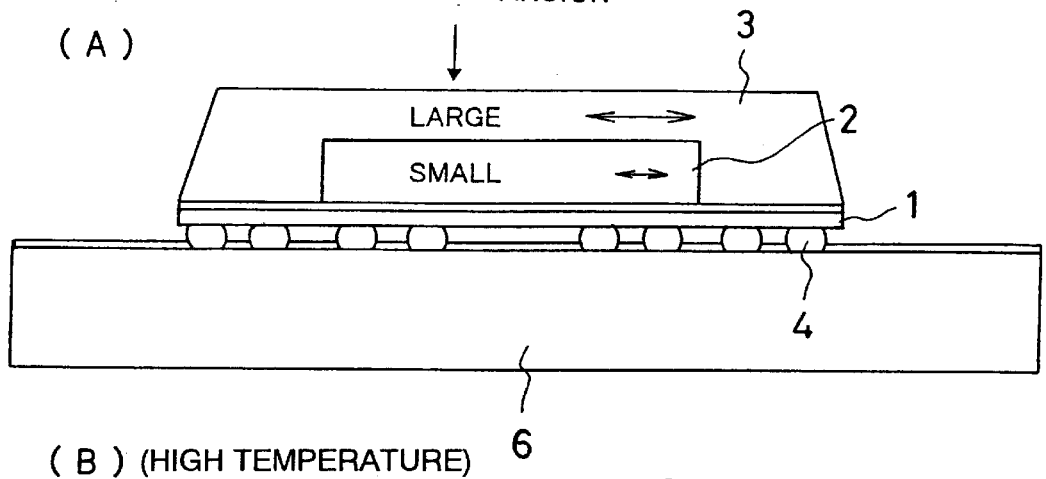
FIGS. 7(A) to (C) show how the semiconductor device warps as the temperature changes.
Figure 7:
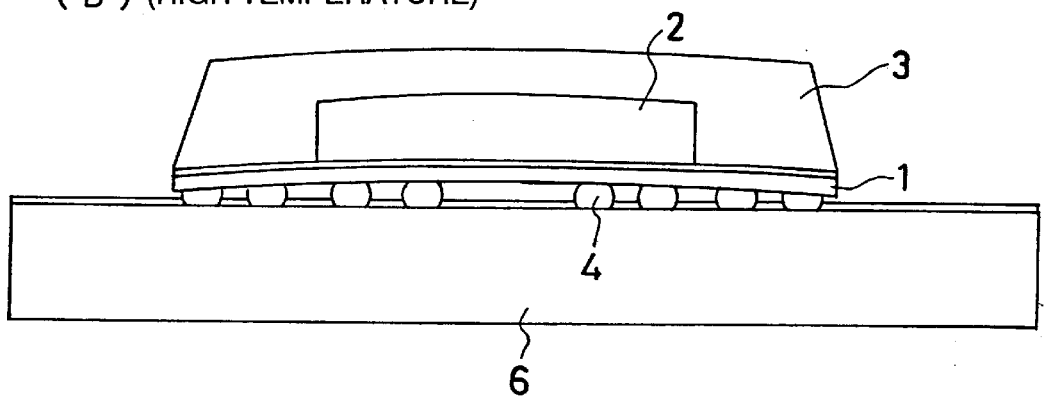
Figure 7:
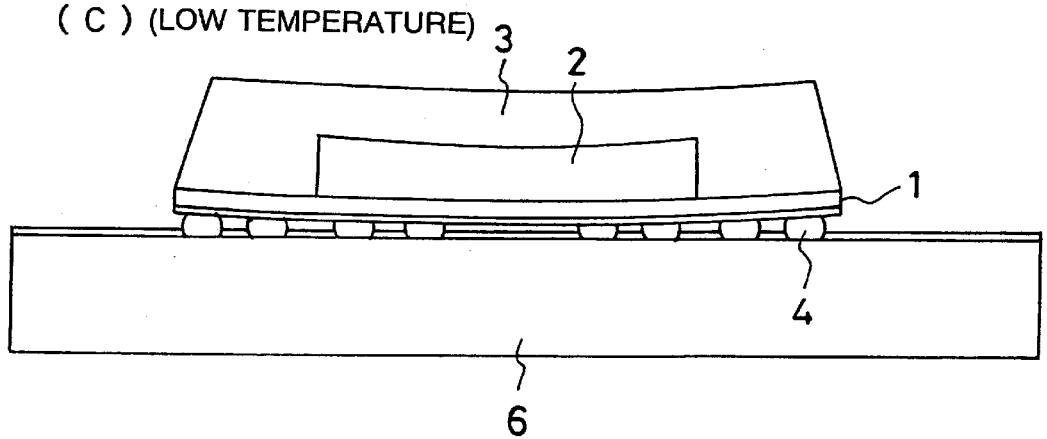

In FIG. 5, a semiconductor device whose "thickness of the mold on the top of the chip" is 0 μm or larger is the semiconductor device shown in FIG. 1 (B). With a2 (thickness of the semiconductor chip) fixed to 350 μm, various samples were created by changing a1 (thickness of the mold resin on the top of the chip) a s follows: 500 μm, 400 μm, 300 μm, 150 μm, and 0 μm. The temperature cycle test was made with these semiconductor devices on the substrate. The vertical axis indicates the number of cycles in which 1 % of samples are defective.

In the graph shown in FIG. 5, a semiconductor device whose side mold thickness is smaller than the thickness of the semiconductor device chip (i.e., the semiconductor device shown in FIG. 2) is indicated as a semiconductor device with a negative thickness value.

The temperature cycle test was made with each of the above-described semiconductor devices mounted on the substrate.

The dimensions of the semiconductor device, other than those described above, are as follows:
Package size: 10.0 mm square
Semiconductor chip size: 7.0 mm square
Substrate thickness: 0.8 mm
Substrate materials: FR-4 (glass cloth, epoxy)

The test shows that the reliability of an semiconductor device installed on the substrate increases as the mold resin on the top of the chip becomes thinner and that the thickness of 350 μm, which is the thickness of the semiconductor device chip, or smaller significantly increases the reliability.

For semiconductor devices with the chip thickness of 250 μm to 500 μm, the test shows the same result.

FIGS. 3 and 4 show the semiconductor devices similar to those shown in FIGS. 1 and 2, except that the thickness of all or part of the mold resin of the fan-out is reduced.

In this embodiment, part of the mold resin above the bumps of the fan-out is about 100 μm or more thinner than that of the semiconductor chip. This increases the reliability of the semiconductor device by 20 to 30 %.

As described above, the semiconductor device according to the present invention reduces or eliminates warp in the semiconductor device itself or in the package in which the semiconductor device is mounted, thus increasing reliability.

The semiconductor device according to the present invention is light in weight and therefore reduces the weight of an electronic component in which the semiconductor device is used.

The semiconductor device according to the present invention improves the effect of the heat sink provided on the top of the package because the mold resin on the top of the semiconductor chip is thin.

What is claimed is:

1. A semiconductor device having a semiconductor chip, the semiconductor device comprising:
   a flexible insulation film attached to the semiconductor device on a first side of the flexible insulation film;
   a plurality of electrode pads disposed on the first side of the flexible insulation film;
   a plurality of electrodes disposed on a second side of the flexible insulation film and being electrically connected to the plurality of electrode pads, the first side of the flexible insulation film being opposite the second side;
   a resin covering the semiconductor chip and sealing the semiconductor chip with the first side of the flexible insulation film,
   wherein a warp caused by a difference between a coefficient of thermal expansion of the semiconductor chip and that of the resin is reduced by a specific thickness relation between a thickness of the resin disposed above the semiconductor chip a1 and a thickness of said semiconductor chip a2, a1 <a2.

2. A semiconductor device according to claim 1, wherein the thickness of the resin sealing the plurality of sides of the semiconductor chip is lower than the thickness of the resin sealing a top of the semiconductor chip.

3. A semiconductor device according to claim 1, wherein a linear expansion coefficient of the resin sealing the semiconductor device chip is 12 ppm or less.

4. A semiconductor device according to claim 2, wherein a linear expansion coefficient of the resin sealing the semiconductor device chip is 12 ppm or less.

5. A semiconductor device according to claim 1, wherein the resin sealing the semiconductor chip comprises a filler having an average sphericity of at least 85.

6. A semiconductor device according to claim 2, wherein said resin sealing said semiconductor chip comprises a filler having an average sphericity of at least 85.

* * * * *